United States Patent [19]

Schade, Jr.

[11] 4,183,020
[45] Jan. 8, 1980

[54] AMPLIFIER WITH FIELD EFFECT AND BIPOLAR TRANSISTORS

[75] Inventor: Otto H. Schade, Jr., N. Caldwell, N.J.

[73] Assignee: RCA Corporation, New York, N.Y.

[21] Appl. No.: 940,573

[22] Filed: Sep. 8, 1978

[30] Foreign Application Priority Data

Sep. 19, 1977 [GB] United Kingdom ............... 38966/77

[51] Int. Cl.² ...................... G08B 17/10; G08B 21/00; H03F 3/16
[52] U.S. Cl. .................................. 340/629; 250/381; 330/264; 330/300; 340/384 E
[58] Field of Search .......... 340/628, 629, 630, 384 E; 330/264, 277, 300; 250/381, 382, 384, 385; 307/251, 279, 304

[56] References Cited

U.S. PATENT DOCUMENTS

| | | | |
|---|---|---|---|
| 3,441,864 | 4/1969 | Hafler | 330/11 |
| 3,500,218 | 3/1970 | Burwen | 330/11 |
| 3,526,845 | 9/1970 | Sikorra | 330/11 |
| 3,536,958 | 10/1970 | Sondermeyer | 361/79 |
| 3,796,967 | 3/1974 | Sondermeyer | 330/207 P |
| 3,921,089 | 11/1975 | Tsurushima | 330/264 |
| 3,974,456 | 8/1976 | Russell et al. | 330/300 |
| 4,054,805 | 10/1977 | Stebbins | 307/304 X |
| 4,097,851 | 6/1978 | Klein | 250/381 |
| 4,103,190 | 7/1978 | Beutler | 330/264 X |
| 4,118,689 | 10/1978 | Peil | 340/629 |

*Primary Examiner*—John W. Caldwell, Sr.
*Assistant Examiner*—Daniel Myer
*Attorney, Agent, or Firm*—Paul J. Rasmussen; William H. Meise; John M. O'Meara

[57] ABSTRACT

A field effect transistor in common-drain amplifier connection is followed in direct-coupled cascade by a bipolar transistor of similar conductivity type, in common-emitter amplifier connection, and without emitter degeneration resistance for limiting its collector current by means of current feedback. Rather the collector current is limited by (a) restricting the range of source voltage variation of the field effect transistor by a threshold conducting means between the source electrode of the field effect transistor and the emitter electrode of the bipolar transistor and (b) inserting a resistance between the source electrode of the field effect transistor and the base electrode of the bipolar transistor to limit the maximum base drive current available to the bipolar transistor when the restricted source voltage of the field effect transistor departs most from the emitter voltage of the bipolar transistor.

22 Claims, 7 Drawing Figures

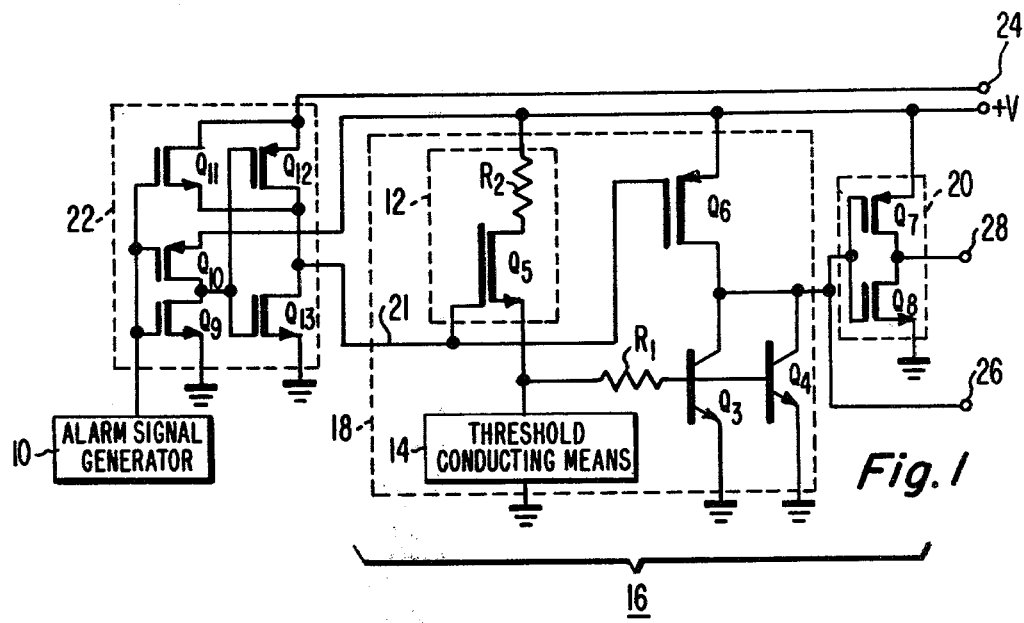
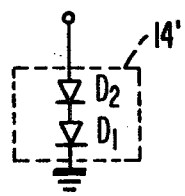
Fig.2a
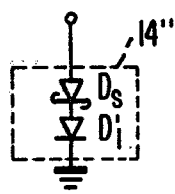
Fig.2b
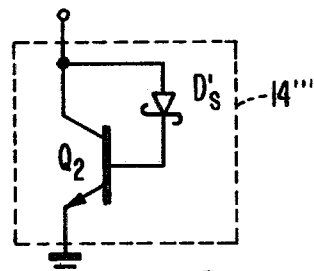
Fig.2c
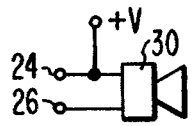
Fig.3
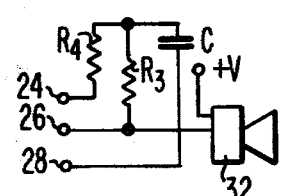
Fig.4
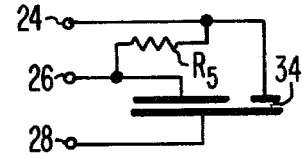
Fig.5

AMPLIFIER WITH FIELD EFFECT AND BIPOLAR TRANSISTORS

The present invention relates to limiting the output current available from a cascade amplifier during extreme excursions of its input signal voltage, which cascade amplifier more particularly comprises a field effect transistor (FET) in common-drain amplifier configuration having its source electrode direct coupled to the base electrode of a bipolar transistor, which bipolar transistor is connected without appreciable emitter degeneration resistance in a common-emitter amplifier configuration.

It is often desirable to cascade individual transistor amplifier stages to obtain operating characteristics unavailable with a single transistor stage. In many applications it is desirable to have an amplifier exhibiting high input impedance, large output current change with small input voltage change as the output potential of the amplifier is swung toward a reference voltage, and limited output current delivery capability thereafter. Previously, designers have used a plurality of bipolar transistors in direct-coupled cascade connection for this purpose, with all the transistors but the last connected in common-collector amplifier configuration and the last connected in a common-emitter amplifier configuration. Suppose the common-emitter amplifier transistor has no emitter degeneration resistance to limit collector current delivery capability by means of current feedback. (It is often desirable to avoid the limitation on output voltage swing an emitter degenerative resistance introduces and to avoid the power dissipation in such an emitter degenerative resistance under high output current conditions.) Then, one may arrange for the impedance of the source supplying input signal potential to the base electrode of the initial common collector amplifier transistor to be sufficiently high that input signal potential will be prevented from further increase once the common-emitter amplifier transistor is fully conductive, this increase being prevented by the clamping action of the serially connected base-emitter junctions of the bipolar transistors augmented by the conduction of the base-collector junction of at least one of the ensuing transistors being biased into saturated conduction.

One may seek as did the present inventor to replace the common-collector bipolar transistor(s) in such a direct-coupled cascade arrangement with a single FET in common-drain amplifier configuration, direct-coupling its source to the base of the remaining bipolar transistor in common-emitter amplifier configuration, with a view to obtaining compatibility with foregoing complementary MOS logic. This requires high input impedance for the cascade amplifier at the gate of the FET, and an input signal voltage translated from a quiescent potential near mid-supply potential to one near reference potential. The FET gate impedance is of the order of $10^{12}$ ohms, so virtually no current flows to the gate of the FET to control its operation and substantially, no current drain is placed on the circuitry supplying input signal potential to the cascade amplifier. The common-emitter amplifier provides the common-emitter forward current gain, $h_{fe}$, one wishes for multiplying the transconductance of the FET to obtain relatively high transconductance for given device size. This is known to result in wider amplifier bandwidth than obtainable by merely increasing FET size to obtain higher transconductance. The problem is that the FET exhibits this high input impedance without regard to whether or not the common-emitter amplifier stage is in conduction. Being only a transconductance amplifier and not a current amplifier, an FET does not transform impedances applied to its source electrode back to its gate electrode in a manner analogous to the way in which a bipolar transistor transforms impedances applied to its emitter electrode up by its ($h_{fe}+1$) to appear at its base electrode. So the mechanism, described in the previous paragraph, for limiting the collector current of the bipolar transistor in common-emitter amplifier configuration without emitter degeneration resistance does not exist in the direct coupled cascade connection of FET in common-drain configuration before the bipolar transistor.

A substitute for this limiting mechanism is necessary, for example, in an application encountered by the present inventor in which it was desired to multiply the transconductance of at least one of the complementary-conductivity metal-oxide semiconductor (MOS) FET's in an inverted amplifier configuration, the FET's being arranged for push-pull conduction in response to an input signal applied to an interconnection between their respective gate electrodes. More specifically, these FET's were included in an integrated-circuit inverter amplifier used in a smoke detector and alarm unit. The inverter amplifier would be called upon to deliver high currents in one direction when driving a mechanical, self-interrupting horn. It was proposed to use a bipolar transistor to provide current gain to multiply the transconductance of the appropriate one of the FET's in the inverter amplifier so the transconductance requirements could be met in a minimum-area integrated circuit. Since home smoke detectors and alarm units are powered by dry cells, it is necessary (a) to limit output current drive to the horn to conserve energy and thus prolong the period that an audible alarm can be sounded by the horn, and (b) to limit spike-through current through the transistors in the output stage to avoid their being harmed by overheating.

The substitute current limiting mechanism, of course, has to affect the gate characteristics of the FET's in the inverter amplifier as little as possible. It would be undesirable to reduce the high input impedance at the interconnection of the FET gates or to appreciably affect the gate potentials at which the FET's would be switched into and out of conduction. In other inverted amplifier applications it may be desirable to multiply the transconductance of both input FET's using bipolar transistors and to use the present invention in each half of the inverter amplifier.

The present invention is embodied in a direct-coupled cascade amplifier with a stage which includes an FET in common-drain configuration followed by another stage which includes a bipolar transistor in common-emitter configuration without appreciable emitter degeneration resistance. The FET and bipolar transistors are both of a first conductivity—that is to say, if the FET be n-channel, the bipolar transistor is NPN, and if the FET be p-channel, the bipolar transistor is PNP. The FET has a range such that its source potential may depart from the emitter potential of the bipolar transistor curtailed by a threshold conducting means that selectivity conducts current between the source electrode of the FET and the point of reference potential the emitter electrode of the bipolar transistor is connected to. Conduction occurs as the departure becomes somewhat larger than the emitter-to-base offset potential of the bipolar transistor, but not appreciably large as compared to the threshold voltage of the FET, assuming it to be an enhancement-mode type. A resistance means connects the source electrode of the FET to the base electrode of the bipolar transistor, its value being chosen in accordance with Ohm's Law to limit the base current available to the bipolar transistor at the maximum departure between the source potential of the FET and the emitter potential of the bipolar transistor. The base current is limited to a level which, when multiplied by the current gain of the bipolar transistor, supports the maximum output current one desires the collector electrode of the bipolar transistor to conduct.

In the drawing:

FIG. 1 is a schematic diagram partially in block form, of a smoke detector in which the present invention is embodied;

FIGS. 2a, 2b and 2c are schematic diagrams of types of threshold conducting means suitable for inclusion in the FIG. 1 circuit; and FIGS. 3, 4 and 5 are schematic diagrams of alternative audible alarm arrangements to be used in connection with the smoke detector unit of FIG. 1.

In the FIG. 1 smoke detector the alarm signal generator 10 typically comprises a bridge connection, one arm of which includes a first ionization chamber open to smoke particles and another arm of which includes a second ionization chamber closed to smoke particles, and an FET differential amplifier with its very high input impedance arranged to sense the unbalancing of the bridge connection when smoke particles enter the open ionization chamber. A switch means 22 responds to the alarm signal generator 10 generating a signal indicative of smoke particles being detected to apply the potential at terminal 24 to the input 21 of an inverter amplifier stage 18. This inverter amplifier stage 18 has an output which connects to a terminal 26 and to the input of a succeeding inverter amplifier stage 20, the output of which connects to a terminal 28. Therefore, amplifiers 18 and 20 are incorporated as separate stages within an amplifier cascade 16. The output signal potentials of inverter stages 18 and 20 are logical complements, each swinging over a range substantially between a reference potential (ground) and an operating potential (+V). An energy cell battery providing a restricted voltage is the usual source for the operating voltage +V, which operating voltage declines as energy is drawn from the battery. A piezo-electric horn with input connections to terminals 26 and 28 will be driven with a voltage swing twice +V, such an alarm device tending to have higher drive voltage and lower drive current requirements than electromechanical horns or electromagnetic loudspeakers. Inverter amplifier 18 is designed to sink sufficient current through terminal 26 and the collector-to-emitter paths of transistors Q3 and Q4 to drive a self-interrupting mechanical horn or the voice coil of an electromagnetic loudspeaker, or a piezoelectric horn. Inverter amplifier 18 is also arranged to a source current through the drain to source path of field effect transistor Q6 and terminal 26 at times when Q3 and Q4 are nonconductive. This completes the direct current path necessary for driving piezoelectric audible alarms from terminal 26. Inverter amplifier 20 supplies the additional inversion necessary in selectively connecting inverter amplifiers 18 and 20 and switch means 22 in a relaxation oscillator when driving an electromagnetic loudspeaker alarm, as well.

Inverter amplifier 18 includes an enhancement-mode field effect transistor Q5 connected in common-drain configuration, with input connection 21 of inverter amplifier 18 connected to its gate. The output current capability of this field effect transistor is to be multiplied by the current gain of a bipolar transistor means, shown as parallelled NPN transistors Q3 and Q4 connected at their emitters to reference potential (ground) and at their collectors to the output of inverter amplifier 18 and thence to terminal 26. To this end, as long as a threshold conducting means 14 is nonconductive, the source current of Q5 is applied in its entirety to the interconnected base electrodes of Q3 and Q4 via a resistive element $R_1$, the value of which is chosen as shall be subsequently explained. Parallelled transistors Q3 and Q4 are used rather than a larger single transistor to avoid the problem of such a transistor tending not to conduct current uniformly over its entire area, the connections of their emitter electrodes to ground typically exhibiting some low resistance (e.g., 1 or 2 ohms) which helps to ballast them for apportioning output current equally between them.

Resistive element $R_2$ connecting the drain of Q5 to +V limits the channel current flowing from the drain to source of Q5 when it is switched into conduction. Thus connected in circuitry as shown, Q5 and $R_2$ function as a switched current supply configuration. The sum of the resistances of $R_1$ and $R_2$ is chosen sufficiently low to supply sufficient current for apportioning between the base electrodes of Q3 and Q4, despite low +V conditions toward the end of the energy cell's life, that their combined collector currents suffice to drive the audio alarm to which terminal 26 connects. Under high +V conditions, reliance upon this form of limiting output current would result in higher output currents than desirable from the standpoint of reducing the drain upon energy cell in order to prolong its life.

The current flowing through a resistive element between the source electrode of Q5 and the base electrode of a bipolar transistor in the bipolar transistor means used to amplify the source current of Q5 equals, in accordance with Ohm's Law, the difference between the source potential of Q5 and the base potential of the bipolar transistor, with this difference being divided by the resistance of that resistive element. By restricting the source potential of Q5 to the value associated with the base current drive to the bipolar transistors being sufficient to support an output current demand at terminal 26 just a little higher than that required to drive the audible alarm device, one can avoid increase in available +V operating potential resulting in a power-wasting increase in output above this level.

The increase in source potential of Q5 is restricted by a threshold conducting means 14 between the source of Q5 and the emitters of Q3, Q4 at reference potential (ground), which means conducts when the potential thereacross exceeds a threshold value to divert further increase in source current from Q5 to itself rather than permitting its flow through $R_1$ to the bipolar transistor means. To avoid the gate potential of Q5 having to swing appreciably more positive to drive the combined collector currents of Q3 and Q4 to prescribed value that it would have to swing if the source of Q5 were connected directly without intervening impedance to the bases of Q3 and Q4, the threshold conducting means 14 should conduct at a threshold potential not so much larger than the emitter-to-base offset voltage ($V_{BE}$) of Q3 and Q4 (about 0.7 volts for silicon transistors) as to appreciably raise the gate potential at which Q5 becomes conductive. This is particularly so where the circuitry of the invention is incorporated into CMOS logic circuits where logic level noise immunity would otherwise be a problem.

FIG. 2A shows a threshold conducting means 14' consisting of the series connection of a pair of semiconductor diode elements $D_1$ and $D_2$, which meets this requirement by conducting at a level approximately twice $V_{BE}$. Diode elements $D_1$ and $D_2$ may comprise bipolar transistors self-biased by respective collector-to-base connections, as known in the art.

FIG. 2B shows a threshold conducting means 14" consisting of the series connection of a semiconductor diode element $D_1'$ and a Schottky diode element $D_S$. Owing to the low offset potential across a Schottky diode element this threshold conducting means 14" will conduct at a level approximately one-and-one-half times $V_{BE}$. The Schottky diode element must have a sufficiently large area to avoid series resistance in the element allowing the source potential of Q5 to continue to rise after threshold conducting means 14" becomes conductive.

FIG. 2C shows a threshold conducting means 14''', in which the collector-to-emitter path of a transistor Q2 is arranged for connection between the source of Q5 and reference potential, and in which a Schottky diode element $D_S'$ is connected between the collector and base electrodes of Q2 and poled for conducting its base current. This base current is lower than the collector-to-emitter current of Q2 by its common-emitter forward current gain, $h_{fe}$, reducing the effect of the resistance of the Schottky diode element upon the clamping of the threshold conducting means. So, for similar clamping action at a level about one-and-one-half times $V_{BE}$, a Schottky diode element $D_D'$ can be used in threshold conducting means 14''' that is smaller than Schottky diode element $D_S$ used in threshold conducting means 14".

Referring back to FIG. 1, inverter amplifier 18 further includes an enhancement-mode field effect transistor Q6 of a conductivity type complementary to that of Q5, with its gate electrode connected like that of Q5 at input connection 21 of inverter amplifier 18, with its source electrode connected to the operating potential V+, and with its drain electrode connected to terminal 26. When the potential on input connection 21 is "high" and approaches V+ potential, Q6 has insufficient source-to-gate potential to be conductive. Q5, however, has sufficient source-to-gate potential to bias it into conduction. Q5 and its drain resistor R2 function as a switched current source 12, furnishing current when Q5 is conductive to forward-bias the base-emitter junctions of Q3 and Q4 to cause them to demand collector currents at terminal 26. Since Q6 is non-conductive and since no current can be drawn from either of the gate electrodes of field effect transistors Q7 and Q8 in inverter amplifier 20 this current demand tends to be met by current flowing through the audible alarm device connected to terminal 26.

On the other hand, when the potential at input connection 21 is "low" and approaches ground reference potential, Q5 has insufficient source-to-gate potential to be conductive. So the switched current source 12 supplies no forward-bias current to the base-emitter junctions of Q3 and Q4, and these transistors are non-conductive. Q6 receives a substantial source-to-gate potential which biases it into conduction to pull the potential at terminal 26 up.

The relationship of the combined collector currents of Q3, Q4 to their combined base currents is defined by the common-emitter forward current gain, $h_{fe}$, they exhibit; and $h_{fe}$ is, of course, subject to variations depending upon variations in the process of fabricating the transistors. In an integrated circuit construction where the resistance of $R_1$ cannot readily be tightly controlled, either by selection or by adjustment, the combined collector currents of Q3, Q4 will exhibit less variation with $h_{fe}$ if the resistance of $R_1$ varies in accordance with $h_{fe}$ variation, increasing as $h_{fe}$ increases, and decreasing as $h_{fe}$ decreases. If Q3 and Q4 are standard vertical-structure types, this can be done by making $R_1$ a doubly diffused pinch-type resistor with its body formed by the same diffusion steps as define the base and emitter regions of the transistor.

Any number of bipolar output transistors could be connected in the circuit of FIG. 1 with their main conduction paths in parallel with those of Q3 and Q4 to accommodate a further increase in output current. However, output current hogging by one of these parallel main conduction paths may occur to cause thermal runaway in the circuit of FIG. 1 when the characteristics of the transistors cannot be matched for some reason, or temperature gradients exist between these transistors. Such current hogging is easily remedied by utilizing separate resistors between the current source 12' and each base of the transistors. Assuming the parallel output transistors to be similar transistors, n in number, each of these separate resistors will have a value n times that of $R_1$. As a matter of design convenience, where integrated circuitry is utilized, each of these resistors could be the distributed base resistances of their associated transistor. Each parallel main conduction path of the transistors could also be connected to the reference voltage through separate resistors of relatively low value to remedy this current hogging problem. However, such resistors will then waste some power in the output path of amplifier 18 even though such power may be of a relatively small magnitude.

Otherwise in FIG. 1, inverting amplifier 20 includes a pair of complementary MOS transistors Q7 and Q8 disposed in a known CMOS inverter arrangement, with their gates commonly connected and their drain-source conduction paths connected in series between the voltage source +V and the reference voltage or ground. The input terminal of this inverter at the gate of Q7 and Q8 is connected to the output terminal 26 of amplifier 18, while its output appears at terminal 28 and is taken from the connection between the conduction paths of Q7 and Q8. A known bilateral transmission gate including MOS transistors Q9, Q10, Q11 and Q12, is combined with an MOS transistor Q13 in the switch means 22. Q9 and Q10 are of complementary conductivity types and are arranged as a conventional inverter with their drain-source conduction paths series connected between +V and ground, while their gates are commonly connected to both the gate of Q11 and the alarm signal of the smoke detector system, such as that which drives the silicon controlled rectifier 46 in U.S. Pat. No. 4,084,156. The drain-source conduction paths of Q11 and Q12 are connected in parallel and these parallel paths are series connected between the signal at a terminal 24 and ground through the drain-source conduction path of Q13. Q11 is of the complementary conductivity type to both Q10 and Q12 while Q12 is of the complementary conductivity type to $Q_{13}$. The gates of $Q_{12}$ and $Q_{13}$ are commonly connected to the connection between the drain-source conduction paths of $Q_9$ and $Q_{10}$. Output from the switch means 22 is connected to the input terminal 21 of amplifier 18 and is taken from the connection between the drain-source conduction paths of $Q_{12}$ and $Q_{13}$.

When a smoke detector alarm signal of positive polarity is applied to the switching means 22 in FIG. 1, the gates of $Q_5$ and $Q_6$ within amplifier 18 are charged through the conduction path of either $Q_{11}$ or $Q_{12}$ in accordance with the voltage polarity which exists at the terminal 24. This is so because $Q_{11}$ and $Q_{12}$ are of complementary conductivity within the bilateral transmission gate of switch means 22 so that the conduction path of $Q_{11}$ is rendered operative directly by the alarm signal which also renders the conduction path of $Q_{12}$ operative through the conventional signal inverting arrangement of $Q_9$ and $Q_{10}$. When no positive smoke detector alarm signal is applied to the switch means 22, the signal inverting arrangement of $Q_9$ and $Q_{10}$ renders the conduction path of $Q_{13}$ operative to discharge the gates of $Q_5$ and $Q_6$ to ground. Otherwise, amplifier 18 functions in the manner described previously, while $Q_7$ and $Q_8$ within amplifier 20 function conventionally to cause the output terminal 26 from amplifier 18 to appear inverted at the output terminal 28.

Because a self-interrupting mechanical horn 30 is actuated by merely connecting it across the required operating voltage, such a horn may be connected to the amplifier cascade 16 of FIG. 1 as shown in FIG. 3 where $+V$ is applied to terminal 24 and through the mechanical horn 30 to terminal 26. When the smoke detector alarm signal is applied to the switch means 22 thereafter, substantially $+V$ will be applied to the gates of $Q_5$ and $Q_6$ through the conduction path of $Q_{12}$ so that terminal 26 is connected substantially to ground through the main conduction paths of $Q_3$ and $Q_4$ within amplifier 18. Therefore, the inverter amplifier 18 sinks the current that the mechanical horn 30 draws from $+V$, with inverter amplifier 20 being surplusage.

Since a loud speaker horn 32 must be AC actuated, it may be connected to the amplifier cascade 16 as shown in FIG. 4 where $+V$ is applied through the loud speaker horn 32 to terminal 26, while an RC network is disposed to apply an oscillating signal to the feedback terminal 24. Within the RC network a capacitor C is connected from terminal 28 to terminal 26 through a resistor $R_3$ and the oscillating signal is connected to terminal 24 through a starting resistor $R_4$ from the connection between C and $R_3$. When the smoke detector alarm signal is applied to the switch means 22 thereafter, $+V$ and ground will be alternately applied to terminal 26 at a frequency that is determined by the RC network. This is so because terminal 28 is always at an inverted voltage level relative to terminal 26 and the gates of $Q_5$ and $Q_6$ are continuously being charged to $+V$ and then discharged to ground due to the oscillating signal at terminal 24. Consequently, the conduction paths through $Q_5$ and $Q_6$ are rendered alternately operative so that the amplifier cascade 16 functions to supply AC current through the loud speaker horn 32.

A piezoelectric horn 34 having a positive feedback tap may be connected to the amplifier cascade 16 as shown in FIG. 5 where the voltage between terminals 26 and 28 is connected across the piezoelectric material while the positive feedback tap is connected to terminal 24 and to terminal 26 through a starting resistor $R_5$.

When the smoke detector alarm signal is applied to the switch means 22 thereafter, the voltage appearing across terminals 26 and 28 causes the piezoelectric material of the horn 34 to distort and this distortion causes a voltage of the same polarity as terminal 26 to develop at the positive feedback tap. Consequently, the gates of $Q_5$ and $Q_6$ within the amplifier cascade 16 are continuously being charged to $+V$ and discharged to ground because the positive feedback tap voltage causes the amplifier cascade 16 to function as an oscillator at the resonant frequency of the piezoelectric material. Therefore, alternating current is supplied across the piezoelectric horn 34.

Other amplifier stages may be added to the amplifier cascade 16, such as a non-inverting preamplifier between the switch means 22 and the inverting amplifier 18 to provide increased loop gain and a balanced transfer characteristic. Furthermore, although the circuitry of FIG. 1 is readily fabricated as an integrated circuit, such circuitry may be assembled from discrete components where desirable.

Although this invention has been disclosed herein by describing only a few embodiments thereof, it should be understood by those skilled in the art that numerous changes in the details of construction and the combination or arrangement of parts could be made in the described embodiments without departure from the true scope and spirit of the invention. Therefore, the present disclosure should be construed as illustrative rather than limiting.

What we claim is:

1. An amplifier comprising:
   a reference potential terminal;
   an operating potential terminal;
   an input signal terminal;
   an output signal terminal;
   a first, enhancement-mode field effect transistor of a first conductivity type having a gate electrode to which said input signal potential terminal connects, having source and drain electrodes, and exhibiting a channel resistance between source and drain electrodes,
   a second, bipolar transistor of said first conductivity type having an emitter electrode connected without substantial intervening impedance to said reference potential terminal, having a collector electrode connected to said output signal terminal, and having a base electrode;
   threshold conducting means connected between the source electrode of said first transistor and said reference potential terminal, exhibiting a relatively high impedance when the potential between the source electrode of said first transistor and said reference potential terminal is less than a threshold value, which is not appreciably large compared to the gate-source forward-bias voltage of said first transistor but is somewhat larger than the emitter-to-base offset potential of said second transistor;
   means for connecting said first field effect transistor in a switched current supply configuration, including a direct current conductive means connecting the drain electrode of said first field effect transistor to said operating potential terminal; and
   first resistance means connected between the source electrode of said first transistor and the base electrode of said second transistor for limiting the current flowing between the collector and emitter electrodes of said second transistor.

2. An amplifier as set forth in claim 1 having:
a third, enhancement-mode field effect transistor being of a second conductivity type complementary to said first, having a gate electrode to which said signal input terminal connects, having a drain electrode connected to said output signal terminal, and having a source electrode; and
means connecting the source electrode of said third transistor to said operating potential terminal.

3. An amplifier as set forth in claim 2 wherein said means connecting the source electrode of said third transistor to said operating potential terminal consists of a direct connection without substantial intervening impedance.

4. An amplifier as set forth in claim 1, 2 or 3 wherein said direct current conductive means connecting the drain electrode of said first transistor to said operating potential terminal includes a resistive element with a first end connected to the drain electrode of said first transistor and with a second end connected to said operating potential terminal.

5. An amplifier as set forth in claim 1, 2 or 3 wherein said threshold conducting means includes a series connection between the source electrode of said first field effect transistor and said reference potential terminal, which series connection essentially consists of a pair of semiconductor diode means each poled to be forward-biased by the source current of said first field effect transistor.

6. An amplifier as set forth in claim 1, 2 or 3 wherein said threshold conducting means includes a series connection between the source electrode of said first field effect transistor and said reference potential terminal, which series connection essentially consists of a semiconductor diode means and a Schottky diode means, each poled to be forward-biased by the source current of said first field effect transistor.

7. An amplifier as set forth in claims 1, 2 or 3 wherein said threshold conducting means includes:
a Schottky diode;
a fourth, bipolar transistor having an emitter electrode and having collector and base electrodes between which said Schottky diode is connected in a poling for conducting the base current of said fourth transistor, one of the collector and emitter electrodes of said fourth transistor being connected to the source electrode of said first transistor and the other being connected to said reference potential terminal.

8. An amplifier as set forth in claim 1 or 2 having in combination therewith the following elements to form a smoke detector:
a self-interrupting electro-mechanical horn connected between said output signal terminal and said operating potential terminal;
controlled switch means responsive to an alarm signal for selectively connecting said operating potential terminal to said input signal terminal; and
alarm signal generator means for generating said alarm signal responsive to smoke.

9. An amplifier as set forth in claim 1 or 2 for functioning as a first inverting amplifier means, in combination with the following elements to form a smoke detector:
an electromagnetic loudspeaker having a voice coil connected between the output signal terminal and operating potential terminal of said first inverting amplifier means;
second inverting amplifier means having an input connection to the output signal terminal of said first inverting amplifier means and having an output connection;
a second resistance having a first end connected to the output signal terminal of said first inverting amplifier means and having a second end;
a capacitance having a first plate connected to the output connection of said second inverting amplifier means and having a second plate;
controlled switch means responsive to an alarm signal for selectively applying, to the input signal terminal of said first inverting amplifier means, the potential appearing at an interconnection between the first end of said second resistance and the second plate of said capacitance.

10. An amplifier as set forth in claim 2 for functioning as a first inverting amplifier means, in combination with the following elements to form a smoke detector:
second inverting amplifier means having an input connection to the output signal terminal of said first inverting amplifier means and having an output connection;
a piezo-electric loudspeaker having input connections to the input connection and the output connection respectively of said second inverting amplifier means and having a positive feedback tap;
a direct coupling of said positive feedback tap to the input connection of said second inverting amplifier means;
controlled switch means responsive to an alarm signal for selectively connecting the output connection of said second inverting amplifier means to said input signal terminal of said first inverting amplifier means; and
alarm signal generator means for generating said alarm signal responsive to smoke.

11. An amplifier as set forth in claim 1 in combination with another amplifier of complementary conduction characteristics having an input connection to said input signal terminal, having an output connection to said output signal terminal, and having a common connection to said operating potential terminal.

12. In an output circuit of the type utilized to drive the audible alarm indicator in a smoke detector system wherein the audible alarm indicator may be a loud speaker, a self-interrupting horn or a piezoelectric horn having a feedback tap, the improvement comprising:
first and second inverting amplifiers each having input and output terminals, said inverting amplifiers being arranged in cascade with said output terminal of said first amplifier connected to said input terminal of said second amplifier; and
switch means for connecting a feedback terminal to said input terminal of said first amplifier in response to the alarm signal of the smoke detector;
an oscillating drive signal being supplied to a loud speaker from a DC power source when that source is connected through the loud speaker to said output terminal of said first amplifier, while said feedback terminal is connected to said output terminal of said first amplifier through first and second series connected resistors and to said output terminal of said second amplifier through the first resistor in series with a capacitor, the frequency of oscillation being determined by the time constant derived from the combination of the capacitor with the second resistor;

a DC drive signal being supplied to a self-interrupting horn from a DC power source when that source is connected through the self-interrupting horn to said output terminal of said first amplifier and also to said feedback terminal;

an oscillating drive signal being supplied to a piezoelectric horn from a DC power source when the piezoelectric horn is connected between said output terminals of said first and second amplifiers, while the feedback tap terminal of the horn is connected to said feedback terminal and a third resistor is connected between said feedback terminal and said output terminal of said first amplifier, the frequency of oscillation being the natural frequency of the piezoelectric material in the horn.

13. In a current limited output circuit of the type utilized to drive the alarm horn in a smoke detector system, the improvement comprising an inverting amplifier which includes:

at least one bipolar output transistor;

a current source having the drain-source conduction path of a first MOS transistor connected to a voltage source through a resistor;

a second MOS transistor of complementary type to said first MOS transistor, said second MOS transistor having its drain-source conduction path connected between said voltage source and the main conduction path of said bipolar output transistor and its gate commonly connected with the gate of said first MOS transistor to the alarm signal of the smoke detector system;

a resistance connected between said current source and the gates of said bipolar output transistor;

threshold means for conducting current from said current source to the emitter of said bipolar transistor when the connection between said resistance and said current source reaches a voltage equal to the sum of two components, the first component being the base-emitter junction forward-bias voltage of said bipolar output transistor and the second component being equal to said resistance multiplied by a predetermined output current limit and divided by the current gain of said bipolar output transistor;

said bipolar output transistor being rendered conductive to actuate the alarm horn when the gate electrode of said first MOS transistor is forward-biased relative to the source electrode thereof by the alarm signal of the smoke detector system and non-conductive to deactuate the alarm horn when the gate electrode of said second MOS transistor is forward biased relative to the source electrode thereof, said predetermined output current limit being accomplished without wasteful power dissipation due to the flow of the alarm horn actuation current through a current monitoring resistor.

14. The output circuit of claim 13 wherein power to a self-interrupting horn from a DC source is controlled through said bipolar output transistor by a switch means for selectively applying said DC source to the commonly connected gates of said first and second MOS transistors in response to the alarm signal of the smoke detector system.

15. The output circuit of claim 13 wherein the supply of an oscillating drive signal to a loud speaker from a DC source is controlled through said bipolar output transistor by a switch means for selectively applying a feedback signal to the commonly connected gates of said first and second MOS transistors in response to the alarm signal of the smoke detector system, said feedback signal being applied from the output of a second inverting amplifier through a capacitor which is series connected to said switch means through a second resistor and series connected to the output of said first inverting amplifier through a third resistor, the input of said second inverting amplifier being connected to the output of said first inverting amplifier, and the frequency of oscillation being determined by the time constant derived from the combination of said capacitor with said third resistor.

16. The output circuit of claim 13 wherein the supply of an oscillating drive signal to a piezoelectric horn having a positive feedback tap is controlled through said bipolar output transistor by a switch means for selectively applying a feedback signal to the commonly connected gates of said first and second MOS transistors in response to the alarm signal of the smoke detector system, said feedback signal being applied from said feedback tap of said piezoelectric horn, the power terminals of said piezoelectric horn being connected between the output of a second inverting amplifier and the output of said first inverting amplifier, said second inverting amplifier having its input connected to the output of said first inverting amplifier and said feedback signal also being connected to the output of said first inverting amplifier through a fourth resistor, the frequency of oscillation being the natural frequency of the piezoelectric material within said horn.

17. An amplifier comprising a pair of complementary field effect transistors arranged to supply push pull output signals to an output terminal in response to an input signal applied in common to their gate electrodes, the first field effect transistor is connected as a common source amplifier having its drain electrode connected to said output terminal; characterized in that:

the second field effect transistor is connected as a common drain amplifier having its source electrode coupled via a current limiting network to the base electrode of a bipolar transistor, said bipolar transistor being connected as a common emitter amplifier having its collector electrode connected to said output terminal.

18. An amplifier as recited in claim 17 wherein said current limiting network comprises a series resistance in the connection between the source electrode of said second field effect transistor and the base electrode of said bipolar transistor and a threshold conduction element connected between the source electrode of said second transistor and the emitter electrode of said bipolar transistor.

19. An amplifier as recited in claim 17 wherein the drain electrode of said second field effect transistor is coupled via a resistance to a supply point to which the source electrode of said first field effect transistor is connected for causing said second transistor to operate as a switched on-off current supply responsive to said input signal.

20. An amplifier as recited in claim 18 wherein said threshold conduction element comprises a series connection of a pair of semiconductor diodes each poled in a sense to be forward biased by the source electrode current of said second field effect transistor.

21. An amplifier as recited in claim 20 wherein one of said diodes comprises a Schottky diode and the other comprises a PN semiconductor junction.

22. An amplifier as recited in claim 18 wherein said threshold conduction means comprises a further bipolar transistor having a collector electrode connected to the source electrode of said second field effect transistor, an emitter electrode connected to the emitter electrode of said first bipolar transistor, and having a base electrode coupled via a Schottky diode to its collector electrode.

* * * * *